(12) United States Patent
Mueller

(10) Patent No.: US 6,798,083 B2
(45) Date of Patent: Sep. 28, 2004

(54) CRYOGENIC POWER CONVERSION FOR FUEL CELL SYSTEMS ESPECIALLY FOR VEHICLES

(76) Inventor: Otward M. Mueller, 96 Sweet Rd., Ballston Lake, NY (US) 12019-1804

( * ) Notice: Subject to any disclaimer, the term of this patent is extended or adjusted under 35 U.S.C. 154(b) by 527 days.

(21) Appl. No.: 09/805,017

(22) Filed: Mar. 13, 2001

(65) Prior Publication Data

US 2003/0190506 A1 Oct. 9, 2003

Related U.S. Application Data

(60) Provisional application No. 60/189,406, filed on Mar. 15, 2000.

(51) Int. Cl.[7] .................................................. H02K 9/00
(52) U.S. Cl. .......................... 307/9.1; 307/149; 310/52
(58) Field of Search ............................. 307/149, 10.1, 307/125; 323/360; 310/52–64

(56) References Cited

U.S. PATENT DOCUMENTS

| | | | |
|---|---|---|---|
| 4,992,623 A | | 2/1991 | Briley et al. |
| 5,010,304 A | * | 4/1991 | Mueller et al. ............. 330/269 |
| 5,126,830 A | * | 6/1992 | Mueller et al. ............. 257/716 |
| 5,170,337 A | * | 12/1992 | Borowiec et al. ........... 363/147 |
| 5,278,502 A | * | 1/1994 | Laskaris et al. ............ 324/318 |
| 5,545,999 A | * | 8/1996 | Mueller et al. ............. 324/322 |
| 5,625,548 A | * | 4/1997 | Gold et al. .................... 363/98 |
| 5,637,922 A | * | 6/1997 | Fillion et al. ............... 257/728 |
| 6,097,181 A | | 8/2000 | Russo |
| 6,112,531 A | | 9/2000 | Yamaguchi |
| 6,489,701 B1 | * | 12/2002 | Gamble et al. ............. 310/179 |
| 6,545,880 B1 | * | 4/2003 | Mueller ....................... 363/14 |

OTHER PUBLICATIONS

O.M. Mueller, E. Mueller: Cryogenic Power/Energy Distribution System. Advances in Cryogenic Engi vol. 45 Kluwer Academic /. Plenum Publ. 2000 pp. 1755–1762.
U.S. patent application Ser. No. 09/593,084, Mueller, filed Jun. 13, 2000.

* cited by examiner

Primary Examiner—Gregory J. Toatley, Jr.
(74) Attorney, Agent, or Firm—Leonard Cooper

(57) ABSTRACT

A cryogenic power conditioning system for fuel cells is proposed which is cooled by liquid hydrogen or liquid natural gas (methane) used to power these fuel cells, or by liquid nitrogen supplied by high-temperature superconducting cables. The main applications are in large vehicles such as transit buses. The result is a combined motor and motor-drive system exhibiting higher efficiency, lower weight, smaller size and lower cost.

18 Claims, 6 Drawing Sheets

On-Resistance ($R_{ON}$) vs. Drain Current ($I_D$)
*APT 10026JN - 1000 V, 33 A, 0.26 Ω,*

On-Resistance vs. Temperature
*APT 10053 LNR*

High-Density Interconnect (HDI) Technology

The Cryo-Super-Chip

Fig. 1. Embedded chip HDI MCM technology cross-section.

**THE CRYO-ASD MOTOR DRIVE
SIDE AND TOP VIEWS

The Stanley-Topology (S-Topology)
Full-Bridge Circuit Using 2 Opposed Current (OC) Half-Bridges

CRYOGENIC POWER CONVERSION FOR FUEL CELL SYSTEMS ESPECIALLY FOR VEHICLES

CROSS-REFERENCES TO RELATED APPLICATIONS

A provisional patent application entitled "High-Efficiency Power Conversion for Fuel Cell Systems, especially for Vehicles" was filed on Mar. 15, 2000. PPA Application number: 60/189,406, Mar. 15, 2000.

A patent application (09/658,719) entitled "High-Efficiency Integrated Motor-Drive System" was filed on Sep. 9, 2000.

STATEMENT REGARDING FEDERALLY SPONSORED RESEARCH AND DEVELOPMENT

LTE was awarded an NSF SBIR contract entitled "Cryogenic Gradient Amplifiers for Magnetic Resonance Imaging (MRI)" in 1997.

MTEK/LTE has been awarded a six-month Phase I SBIR by DoD-BMDO entitled "High-Voltage Cryo-Inverter" (Jun. 15, 2001).

REFERENCES TO A "MICROFICHE APPENDIX"

None

BACKGROUND OF THE INVENTION

1. Technical Field of the Invention

This invention relates to high-efficiency (>99.5%) power conditioning electronics used to convert the DC output of fuel cells into suitable AC power, especially useful for applications in vehicles such as buses, trucks, and ships.

2. Description of Related Art

Prior art is given by the existing technologies for transportation based on combustion engines. A worldwide effort is underway to implement new, environmentally cleaner means of portation by converting to electric propulsion. Fuel cells are considered for this application.

BRIEF DESCRIPTION OF THE INVENTION

According to news reports [1] General Motors developed a car called "Zafira" which operates on fuel cells powered by liquid hydrogen, which has a cryogenic temperature of 20.27 K (−252.88° C.). Other fuel cells use a reformer which extracts hydrogen gas from natural gas (methane, $CH_4$) or gasoline [3, 4]. Alternatively, liquid natural gas (LNG) at a temperature of −161.5° C. (112 K) presents interesting possibilities which will be part of this invention disclosure.

Fuel cells deliver DC power, which is then converted by so-called inverters into AC power required for general use and for the efficient operation of electrical motors. These inverters are often larger, heavier, and more expensive than the motors they control.

The new concept of Cryogenic Energy/Power Conversion (CEC, CPC) has achieved drastic reductions in size, weight, and cost in the field of power electronics (Cryo-Micro-Power, CMP). Such size and weight reductions are nowhere more important than in vehicles, where energy savings are crucial. However, when applied to motor drives for transportation (or other) applications, CEC presents a major problem: the cooling, which adds further weight and requires an additional tank. This problem is solved in the case where a cryogenic fuel such as liquid hydrogen or liquid natural gas are already available, opening up interesting possibilities. On the other hand, CEC can achieve its full potential only if implemented in the form of Cryo-Multichip Modules (CMCM) made with the wireless High-Density Interconnect (HDI) technology [P6,11,12,13]. This technology interconnects power transistor/diode chips in a half-bridge or full-bridge topology with polymer and metallic thin-films, thus eliminating the weak link in power electronics: the wire bond connections. Wireless interconnection provides many advantages such as higher switching speeds, higher frequencies, and improved efficiency and reliability.

The great potential of silicon applications in power and energy conversion (solid-state transformers, inverters, etc.) has not yet been adequately addressed by the semiconductor industry. It is desirable to change this situation by promoting the concept of cryogenic energy conversion, discussed in greater detail below. Furthermore, CMCMs are most important in transportation systems, and will be the key component for realizing Cryogenic Energy Conversion. An application example is described in the following pages. Systems can be optimized by combining CMCMs with High-Temperature Superconductors, especially when used to implement small filter inductors.

The widespread application of electric vehicles requires the development of a sufficiently small, light, and efficient motor drive or Adjustable Speed Drive (ASD) to couple the fuel cell or battery output to the motor. Therefore multichip modules are proposed for an efficient motor drive system based on the following assumptions and suggestions:

Sooner or later, High-Temperature Superconductors (HTS) will be commercially available for applications in the power and energy generation and distribution fields at competitive prices: HTS cables, HTS transformers, HTS motors, HTS generators, etc. Billions of dollars have already been invested in this new HTS technology since its discovery in 1986.

HTS components require Cryogenic Cooling. In most cases, such as in HTS cables and transformers, liquid nitrogen (LN2), at a temperature of 77 K (−196 C), will be used The availability of HTS components requires a rethinking and redesigning of many energy systems. HTS Technology can best be supported by the new concept of Cryogenic Energy Conversion (CEC) based on Low Temperature Electronics (LTE) and Cryo-MOSFEts, Cryo-IGBTs, or other cryogenically operated devices.

CEC can provide a considerable improvement in power and energy conversion efficiency as well as a drastic reductions in size, weight and, therefore, cost: Micro Cryo-Power. CEC represents the mating of High-Temperature Superconductors with Low-Temperature-operated Semiconductors. Electronic efficiencies of >99.5% should be possible (not considering the cooling penalty).

The efficiency of electrical motor operation can be drastically enhanced by applying CEC to Motor Drives or ASDs. CEC would miniaturize these drives, which can be 2–3 times more expensive in prior art technologies, and are also much larger and heavier than the motors they control.

Size and weight reduction, along with improved conversion efficiency, is nowhere more important than in transportation vehicles. Every kilogram of weight reduction translates into a considerable energy saving for vehicles traveling hundreds of thousands of miles in a lifetime.

The push for higher efficiency leads to a push for electric vehicles requiring motors and ASDs.

Great progress has been made recently (New York Times, Oct. 21, 1997) in the field of Fuel Cells using gasoline or Liquid Natural Gas (LNG: 112 K, −161 C).

Therefore, this invention describes an ultra-small and light-weight Cryogenic Adjustable Speed Motor Drive in the power range of 50 to 200 Hp (35 to 150 kVA) using Cryo-MOSFETs or other suitable devices such as IGBTs.

Tremendous commercialization opportunities providing higher energy conversion efficiencies can be envisioned for many transportation systems combining ($H_2$, $O_2$) fuel cells using LNG, $LH_2$, HTS motors, HTS cables and Cryo-Motor-Drives.

In the case where HTS motors are used, the small cryopower electronics can be integrated inside the HTS motor or onto the case of the HTS motor.

Motor drives using Cryo-Multichip Modules (CMCM) are intended for application in vehicles (buses, trucks, trains, ships, airplanes) as one important component in the coming age of Cryogenics which will combine High-Temperature SUPER-Conductors with Low-Temperature SEMI-Conductors. Such Adjustable Speed Drives (ASDs) will, of course, find applications in stationary systems as well. Many manufacturing plants requiring ASDs already use liquid nitrogen for other purposes. The proposed CMD will provide smaller size, reduced weight and increased efficiency due to its application of the new concept of Cryogenic Energy Conversion (CEC). Every kilogram of weight reduction translates into a considerable fuel saving over the lifetime of a vehicle running hundreds of thousands of miles. Such a development should be desirable in view of the fact that the federal government now mandates that cities of certain sizes must provide alternatively-fueled methods of public transportation ("Cold Facts", Summer 96 Issue).

Nothing beats semiconductor technology as far as reliability and reductions in size, weight, and cost are concerned. It is finally time to apply this technology to the field of (high) power conversion. This is made possible by the concept of Cryogenic Energy Conversion (CEC).

A press release of Aug. 1, 1997 reads as follows: "Governor Pataki Announces Bond Act Funding for Clean Buses". Also: "Governor George E. Pataki today announced the State will award $3 million for the purchase of 39 clean-fuel buses as part of the Clean Fuel Bus Program under the Clean Water/Clean Air Bond Act". These hybrid buses use CNG (compressed natural gas) to fuel a Diesel engine. They are described in an article by King et al., in the IEEE Spectrum of July 1995 [6] which presents the prior art. His figures [6, p. 29] show how small the motor is compared to the inverter motor drive.

The next step in the development of the electric transit bus could be the use of fuel cells to replace the diesel engine as a power source. Many companies are working to develop such fuel cells. Very interesting possibilities exist in the application of the new fuel cell technology. For large vehicles such as buses, LNG (liquid natural gas) is desirable, and makes the task of applying fuel cell technology easier. CVI, Inc. has successfully designed and manufactured onboard LNG fuel systems for buses such as those used by the Houston, Tex., METRO transit coach system.

BRIEF DESCRIPTION OF THE SEVERAL VIEWS OF THE DRAWINGS

The concept of Cryogenic Energy Conversion (CEC) is based on the fact that certain semiconductor devices, especially high-voltage power MOSFEts (metal-oxide semiconductor field-effect transistors) work much better when cooled to cryogenic temperatures [M1-M18]. For example, the on-resistance R(on), a major source of loss, is reduced by a factor of 20 to 35 by immersing the devices into liquid nitrogen (T=400 K/77 K).

The physics behind CEC is the drastic increase at low temperatures of the majority carrier electron mobility in the drain-drift region of a high-voltage power MOSFET. MOSFETs are the fastest switching power devices available [M8]. For a 100-Hz silicon motor drive, the PWM (pulse-width-modulated) switching frequency of a switch-mode inverter can be low (1–20 kHz) so that switching losses are also small or negligible if soft-switching techniques are applied. The maximum efficiency is determined by the ratio of on-state voltage to the voltage swing. The APT MOSFET APT 10050 LVR, rated 1000 V, 21 A, and 0.5 Ω (at 300 K), has an on-resistance of 24.2 mΩ at 77 K, i.e. immersed in liquid nitrogen (LN2). For a supply of 650 V, a current of 10 A, and 2 MOSFETs in series (as is usual in bridge circuits), the on-state voltage to voltage swing ratio is:

$$L = 2\frac{0.242\ V}{650\ V} = 0.00075$$

This corresponds to a conduction loss efficiency of more than 99.9%. Assuming a cooling penalty of a factor of 10 and negligible switching losses at these low frequencies, an overall ASD inverter efficiency of >99.0% should be possible. By paralleling more MOSFEts, one can further reduce the losses to any desirable level: "Silicon is cheap"! In addition, one should take into account the "load shedding" property of liquid nitrogen. LN2 can be generated in off-peak hours.

Another advantage of CEC is the fact that the thermal conductivity of silicon and of MOSFET chip substrates also improves drastically when cryo-cooled [M7]. The basic idea of CEC is to reduce loss from heat directly at the source by cryo-cooling.

Cryo-Multi-Chip Modules (CMCMs)

A conventional motor drive can be large compared to the motor it is designed to operate. Clearly, any reduction in size and weight (and consequently in cost) would be especially advantageous for transportation applications. Multi-Chip Modules have proven to achieve this goal in other industries (most notably aerospace). However, this advantage has not yet been applied to the power electronics industry because of the high power densities involved, which are now reduced by cryo-cooling. By using Multi-Chip Modules optimized for use at cryogenic temperatures, however, the entire volume previously dedicated to cooling systems for the motor drive circuitry can be removed. The resulting reduction in size and weight can be drastic.

Figure 1:
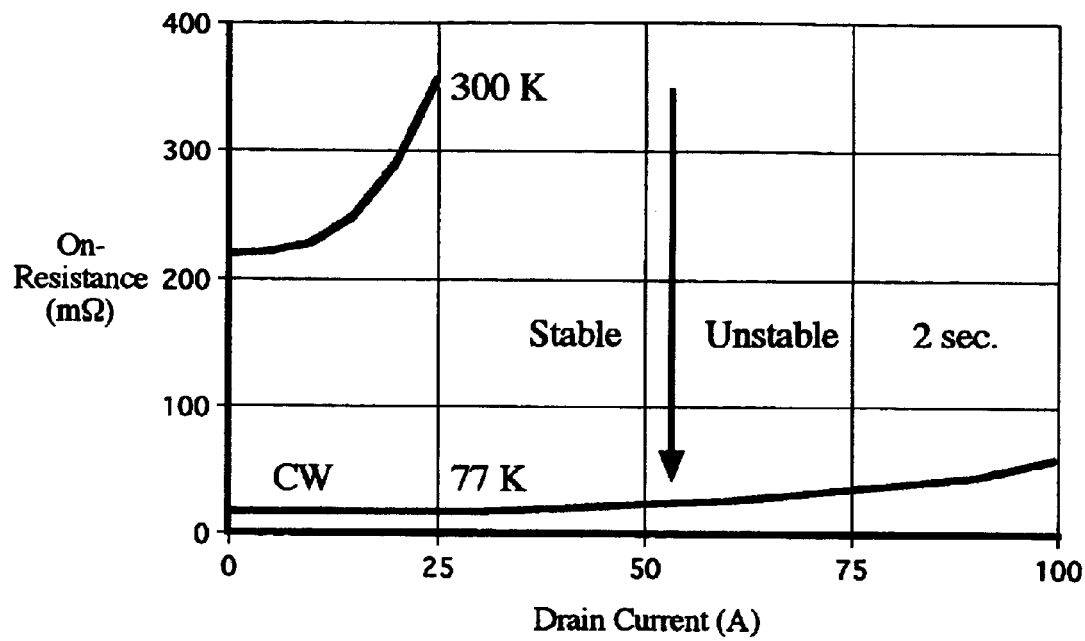
FIG. 1 shows the drain current dependence of R(on) for a 1000 V, 33 A MOSFET APT 10026JN. Up to a current of 55 A, the on-state voltage or resistance is absolutely stable and constant at 77 K.
Figure 2:
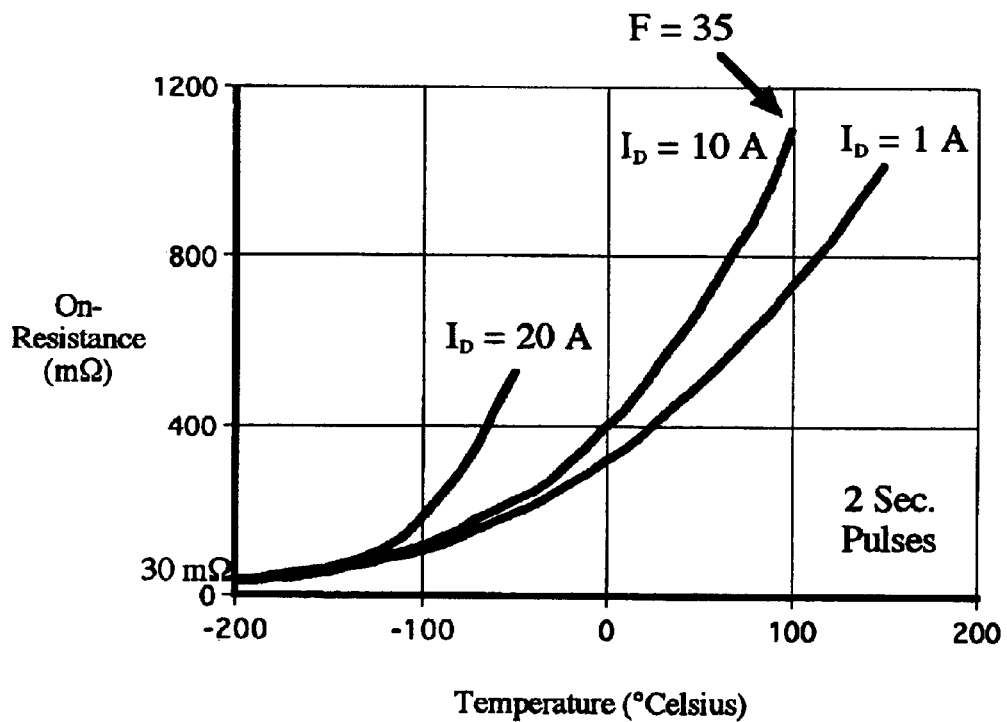
In FIG. 2 the measured temperature dependence of R(on) is plotted for a 1000 V, 20 A, 0.53 Ω MOSFET APT10053LNR for drain currents of 1 A, 10 A, and 20 A. Assuming a maximum junction temperature of 100° C. (375 K) for normal operation (300 K), one obtains an R(on) improvement factor of 35 from 375 K to 77 K.
Figure 3:
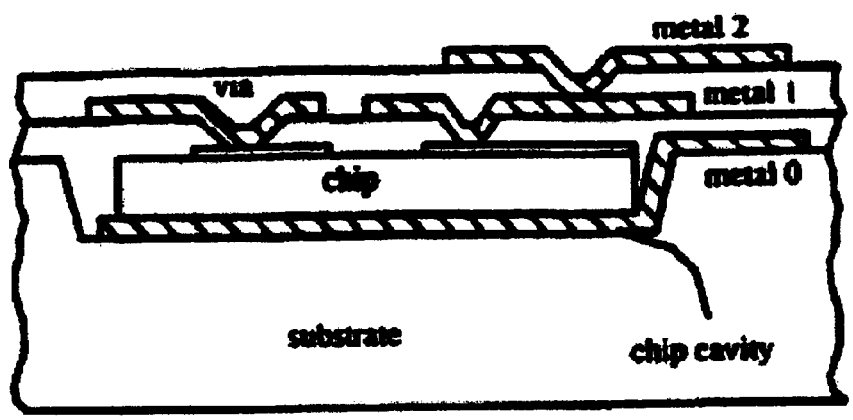
Figure 4:
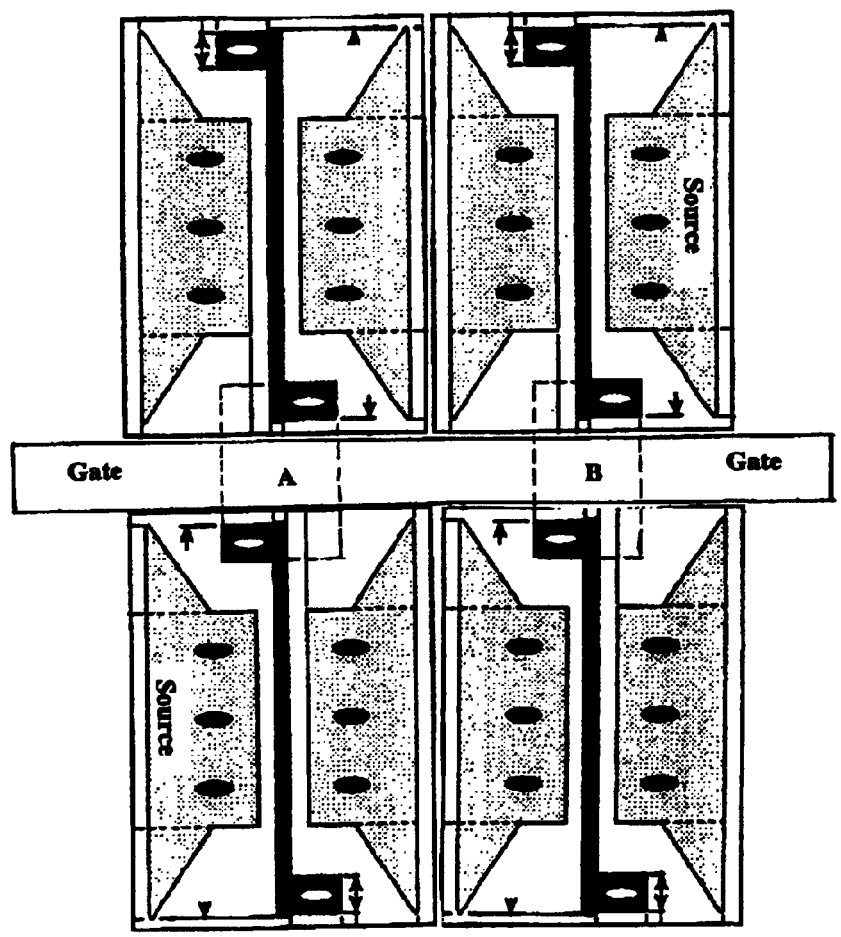
Figure 5:
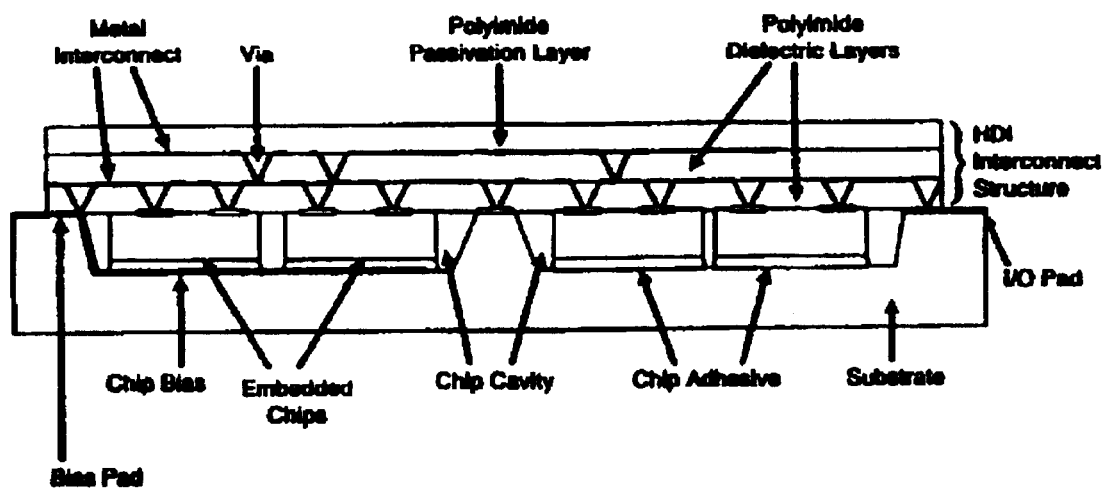

FIGS. 3, 4, and 5 show various embodiments of the Cryo-Multi-Chip Module using the GECRD High-Density Interconnect (HDI) technology [11–13].

The proposed cryo-power motor drive will be an important component in the ultimate high efficiency vehicle (transit bus, ship, truck, etc.), which combines the emerging technologies of high-density interconnects (HDI), fuel cells, HTS electric motors and low-temperature power electronics. The Cryogenic Electric Fuel Cell Transit Bus: The "Cryo-Bus"

Figure 6:
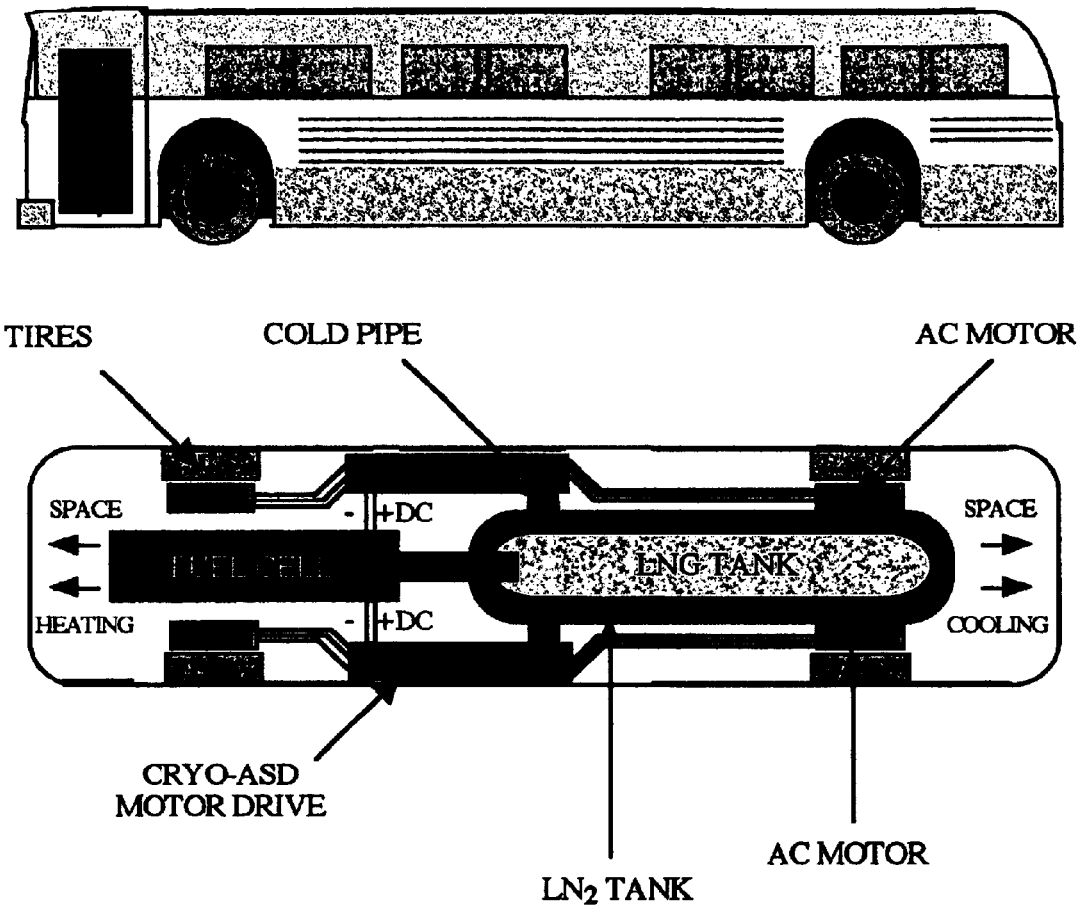

Assuming that a fuel cell as described in the References [2–4] will be available some day in the future, one can envision an electric transit bus as shown in FIG. 6. A liquid natural gas tank operating at a temperature of 112 K may or may not be surrounded by a liquid-nitrogen tank (77 K), which would act as a protective shield should an accident occur. Thus the Cryo-ASD motor drive can be cooled either by LN2 or by conduction cooling via 'cold pipes' or 'cold fingers' extended directly from the LNG tank. The LNG tank supplies the fuel cell, which in turn generates heat to be used for space heating in the winter months. During the summer, the LNG tank could contribute to space cooling. The electric motors may or may not be implemented using HTS wires or conductors for even smaller size and weight. This invention limits itself to the miniaturization and efficiency optimization of the four motor drives though the application of the concept of CEC using CMCMs or cryo-MOSFETs.

The liquid nitrogen tank may not be necessary and the cryo-power electronics may be located in a hermetically sealed case which is immersed in the cryogenic liquid natural gas. In this case the small losses of the cryo-power electronics would help to evaporate the LNG for use in the reformer of the fuel cell. All cryogenic dewars, tubes, etc. are thermally insulated by multilayer insulation in a high vacuum.

Figure 7:
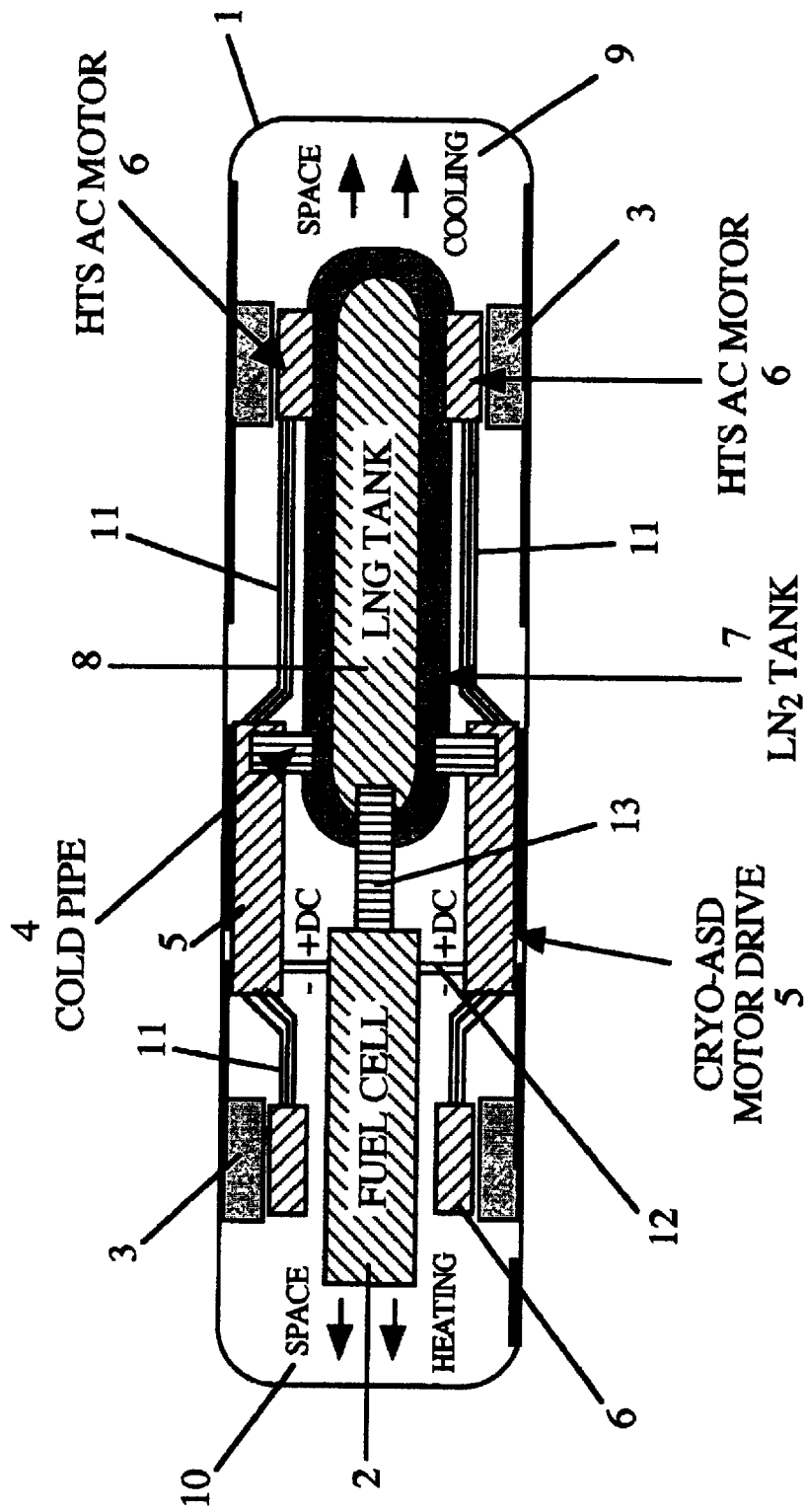

The concept of FIG. 6 also applies, of course, to a bus or vehicle where liquid hydrogen ($LH_2$) is used instead of LNG. In this case the cryo-power electronics would be cooled in a space between the $LH_2$ tank and the ambient at a suitable temperature gradient point in the range of 77 K to 200 K FIG. 7 shows the details of the cryo-bus enlarged.

Figure 8:
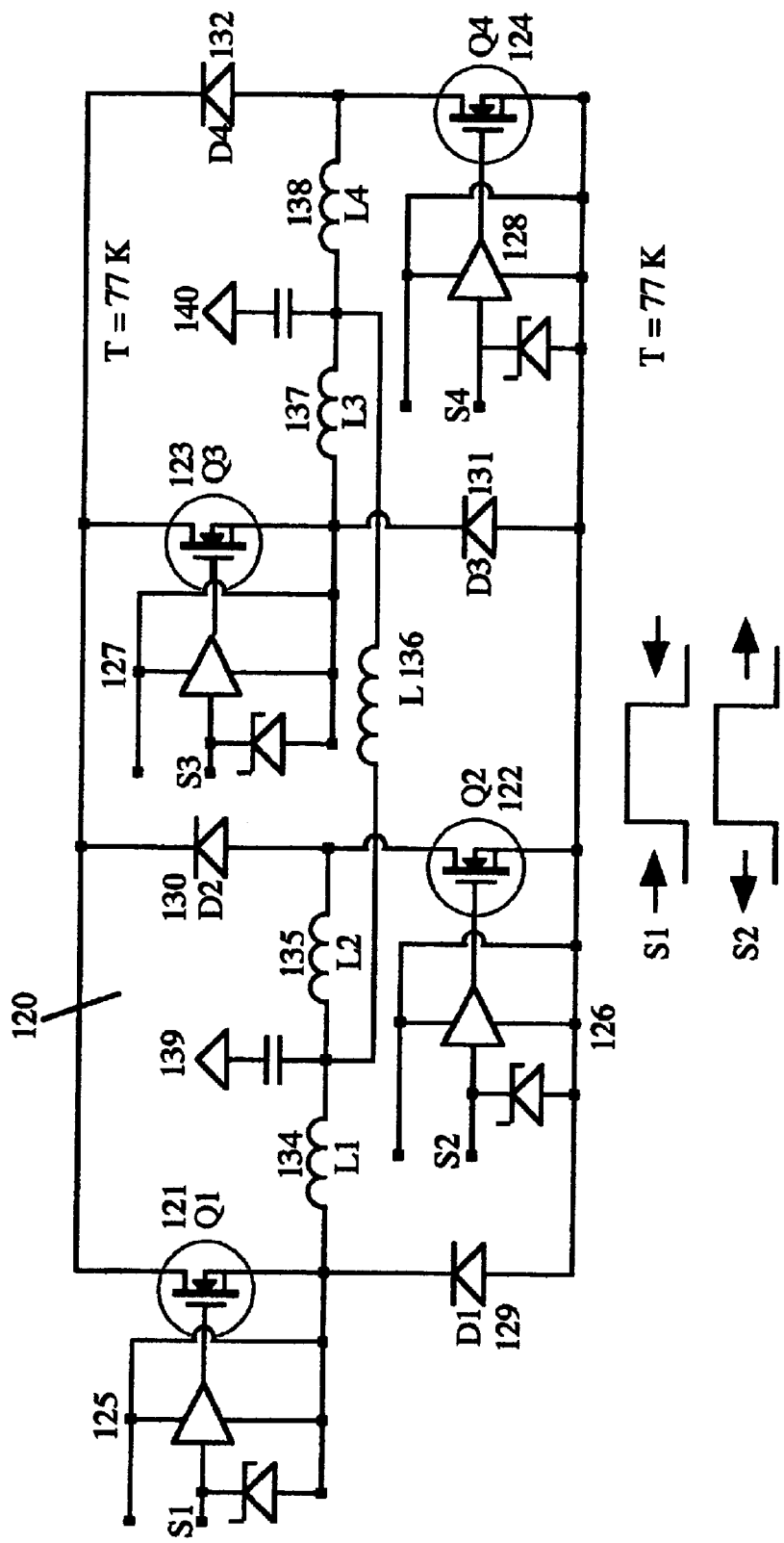

A circuit topology as shown in FIG. 8 may be used for the implementation of a cryo-inverter used in combination with the fuel cell. The inverter circuit may be preceded by a boost converter to increase the low output voltage of the fuel cells. In the case where liquid nitrogen is used one can also use liquid oxygen (LOX) produced together with the LN2 for more efficient operation of the fuel cell. In this case it may be possible to eliminate the (necessary) pressurizing of the oxygen supplied to the fuel cell.

DETAILED DESCRIPTION OF THE INVENTION

The key objective of this invention is to apply the concept of cryogenic power conversion to fuel cell-operated electric vehicles and other systems which use either liquid hydrogen {GM car Zafira [1]} or liquid natural gas (LNG) in order to achieve the ultimate in high power conversion efficiency for environmentally friendly transportation. Here, use is made of the fact that the cryogenics is already available and can therefore solve the cooling problem of the cryogenic power electronics plant 8.

The advantages would be higher efficiency, lower weight, smaller size and lower cost for the required power electronics in a fuel cell-operated vehicle.

The invention is demonstrated in FIG. 7:

A large vehicle such as a bus 1 uses a fuel cell (FC) 2 which converts oxygen and hydrogen into electrical energy. The wheels 3 are driven by the combination of an adjustable speed motor drive 5 and an electrical motor 6. The hydrogen needed by the fuel cell 2 can be provided by a liquid hydrogen tank or can be obtained via a reformer from liquid natural gas (LNG, CH4) stored in an LNG tank 8. The liquid natural gas tank 8 could, of course, also be a liquid hydrogen tank. The latter can be placed inside a larger tank 7 containing liquid nitrogen for additional cool-storage and for protection in case of an accident The motors 6 could use high-temperature superconducting wires for their windings and can also be cooled by liquid hydrogen or by liquid nitrogen. The cryo-motor drives 5 could be integrated into and with the HTS motors 6 if multi-chip modules are employed.

The cryo-power electronics 5 could also be placed in a hermetically sealed case (not shown), immersed in the $LH_2$ or LNG tank 8. The heat generated by the fuel cell 2 can be used for space heating 10 in the bus. The cryo-dewar 8 can also be used for space cooling 9 during the summer. The cryo-motor drives 5 are fed by electrical conductors 12 with a suitable DC voltage. Cables 11 in turn feed electrical power to the motors 6. These conductors 11 could be high-temperature superconducting (HTS) cables which provide HTS bus motors 6 with electrical power as well as the cooling fluid (LN2). Tube equipment 13 delivers the natural gas or the hydrogen gas to the fuel cell 2.

The adjustable speed motor drives 5 can be implemented with conventional half- or full-bridge circuits, or an interesting new topology 20, the Stanley topology [9] shown in FIG. 8 can be used The whole circuitry is placed inside a dewar exhibiting good thermal insulation walls, preferably using multi-layer vacuum insulation (MLI).

The motor drive circuitry if implemented in the topology of FIG. 8 consists of transistors, preferably MOSFETs, 21–24, controlled by drive circuits 25–28 and operated with pulse-width modulation (PWM). Commutating diodes 29–32 may be implemented with cryo-silicon or cryo-germanium devices. The latter have a much lower on-state voltage. Inductors 34–38 could be implemented with high-temperature superconductors. Together with capacitors 39 and 40 they form a filter for the elimination of the pulse-width modulation frequency. Inductor 36 constitutes the windings of the motors. The MOSFEts 21–24 and diodes 29–32 can be implemented in the form of cryo-multi-chip modules providing miniaturization This motor drive circuitry can have an electronic efficiency (without cooling penalty) of greater than 99.7%.

It has been found that some gallium-arsenide based light-emitting diodes (LEDs) can exhibit 1–2 orders of magnitudes higher light output if cryo-cooled. Thus, cryo-cooled LEDs can be used in the Cryo-Bus of this invention for indoor and outside lighting applications.

Relevant Patents

P1 O. Mueller and W. A. Edelstein, "Cryogenically Cooled Radio-Frequency Power Amplifier," U.S. Pat. No. 5,010,304, Apr. 23, 1991

P2 O. Mueller and L. S. Smith, "Cryogenic Semiconductor Power Devices," U.S. Pat. No. 5,126,830, Jun. 30, 1992

P3 J. C. Borowiec, O. M. Mueller, and S. A. El-Hamansy, "Low-Inductance Package for Multiple Paralleled Devices Operating at High Frequencies," U.S. Pat. No. 5,170,337, Dec. 8, 1992

P4 C Gold, O. Mueller, and E. Schempp, "Control Circuit for Cryogenically-Cooled Power Electronics Employed in Power Conversion Systems:" U.S. Pat. No. 5,625,548, Apr. 29, 1997

P5 W. Wirth, T. McFarland, R. Vavrek, P. Roemer, O. Mueller, and J. Park, "Split gradient amplifier for an MRI system," U.S. Pat. No. 5,270,657. Dec. 14, 1993.

P6 R. Fillion, O. Mueller, J. Burgess, "Wireless RF Power Semiconductor Devices using High-Density Interconnect." U.S. Pat. No. 5,637,922, Jun. 10, 1997.

P7 O. Mueller, C. Yakymshyn, P. Roemer, R. Watkins: "Preamplifier Circuit for Magnetic Resonance Imaging Systems", U.S. Pat. No. 5,545,999, Aug. 13, 1996.

P8 E. Laskaris, B. Dori, N. Vermilya, and O. Mueller, "Refrigerated Superconducting MR Magnet with Integrated Cryogenic Gradient Coils," U.S. Pat. No. 5,278, 502, Jan. 11, 1994.

P9 J. Park, O. Mueller, and P. Roemer, "Gradient Current Speed-Up Circuit for High-Speed NMR Imaging System:" U.S. Pat. No. 4,961,054, Oct. 2, 1990.

P10 O. Mueller, P. Roemer, and W. Edelstein, "Gradient Current Speed-Up Circuit for High-Speed NMR Imaging System," U.S. Pat. No. 5,017,871, May 21, 1991.

Relevant Publications on CPC

M1 O. Mueller, "RF Components at Low Temperatures," *Proceedings of RF EXPO EAST*, Philadelphia, Oct. 25–27, 1988, and RF-Design, January 1989.

M2 O. Mueller, "Cryogenic MOSFET power conversion—Is it feasible?" *Proceedings of the GE-GOSAM Hybrid & Packaging and ADC Electronics Panel Meeting*, Sagamore Resort and Conference Center. Bolton Landing, N.Y., Apr. 11–13, 1989

M3 O. Mueller, "Cryogenic MOSFET power conversion," *Proceedings of the IEEE Workshop on Low Temperature Semiconductor ELectronics*, pp. 94–98, University of Vermont, Aug. 7 & 8, 1989 (IEEE 89TH0252-7)

M4 O. Mueller, W. A. Edelstein, and P. B. Roemer, "The cryogenic NMR gradient amplifier," *Eighth Annual Meeting, Society of Magnetic Resonance in Medicine*, Book of Abstracts, Part 2, p. 970, Amsterdam, The Netherlands, Aug. 12–18, 1989

M5 O. Mueller, "On-resistance, thermal resistance, and reverse recovery time of power MOSFETs at 77 K," *Cryogenics*, vol. 29, pp. 1006–1014, October 1989

M6 O. Mueller, "RF Components at Low Temperatures," *RF DESIGN*, vol. 12, no. 1, pp. 29–39, January 1989

M7 O. Mueller, "The cryogenic power MOSFET," *Proceedings of the 20th International Power Conversion Conference*, Mimichen, Germany, Jun. 25–29, 1990 (Also GE CRD 90CRD206)

M8 O. Mueller, "Switching losses of the cryogenic MOSFET and SIT," *Cryogenics*, vol. 30, pp. 1094–1100, December 1990 (Also an oral paper at the *International Conference on Low Temperature Electronics*, Berkeley, Calif., Apr. 23–26, 1990)

M9 O. Mueller and W. A. Edelstein, "The cryogenic NMR RF power amplifier," *Society of Magnetic Resonance in Medicine (SMRM)*, 9th Annual Meeting, New York, N.Y., Book of Abstract, p. 205, Aug. 18–24, 1990

M10 O. Mueller, "Cryogenic power conversion: Combining superconductors and semiconducting devices," *Fifth Annual Conference on Superconductivity and Applications, NYSIS*, Buffalo. N.Y., September 1991.

M11 O. Mueller, "Cryogenic power conversion: Combining superconductors and semiconducting devices," *American Institute of Physics*, "Superconductivity and its Applications." vol. 251, pp. 746–760, March 1992

M12 O. Mueller, K. Park, W. A. Edelstein (CRD). C. Park, S. S. Bayya, and R. L. Snider (Alfred University), "A cryogenic RF power amplifier (soon) using (HT) superconducting resonance inductors," *NYSIS Sixth Annual Conference on Superconductivity and Applications*, Buffalo, N.Y., Sep. 15–17, 1992: *AIP Conference Proceedings*, no. 273: "Superconductivity and its Applications," pp. 492–502 (Editors: H. S. Kwok et al.)

M13 O. Mueller and K. Herd, "Ultra-high efficiency power conversion using cryogenic MOSFETs and HT-superconductors," *IEEE PESC*-93, pp. 772–778, 1993

M14 R. D. Black, T. A. Maily, P. B. Roemer, O. M. Mueller, et al., "A high-temperature superconducting receiver for Nuclear Magnetic Resonance Microscopy," *Science*, vol. 259, pp. 793–795, Feb. 5, 1993

M15 O. Mueller and J. N. Park, "Quas-linear IGBT inverter topologies:" *IEEE APEC* 94, vol. 1, pp. 253–259, February 1994

M16 R. D. Black, P. B. Roemer, and O. Mueler, "electronics for a high-temperature superconducting receiver system for Magnetic Resonance Microimaging," *IEEE Transactions on Biomedical Engineering*, vol. 41, no. 2, pp. 195–197, February 1994

M17 O. Mueller, "Cryo-MOSFET and IGBT: A comparison," *Second European Workshop on Low Temperature Electronics (WOLTE-2), Journal de Physique*, colloque 3, vol. 6, pp. C3.219–C3.224, Belgium, Jun. 1996

M18 O. Mueller, "Properties of high-power cryo-MOSFETs." *Conference Record of the 1996 Annual IEEE Industrial Applications Society Meeting (IAS-96)*, vol. 3, pp. 1443–1448 (IEEE 96CH35977), San Diego, Calif., October 1996

M19 W. Edelstein, I. Iben, O. Mueller, E. Uzgiris, H. Philipp, and P. Roemer, In *Environ. Prog.* 1994, vol. 4, p.13

M20 J. Hudgins, C. Godbold, W. Portnoy, and O. Mueller, "Temperature Effects on GTO Characteristics," *IEEE IAS-94 Conference Record*, pp. 1182–1186, 1994

General References

1. AE (Alternative Energy) List Brucedp@iname.com, Mar. 5, 2000, "REN (Zafira FCEV, definitely H2, PNGV, SatCon, Nissan/CFCP)-Long".
2. M. L. Wald: "In a Step Toward a Better Electric Car, Company Uses Fuel Cell to Get Energy From Gasoline". NY Times, Oct. 21, 1997.
3. T. Kane: "Electric car breakthrough reported—MTI joint venture receives grant to develop fuel cells for home use". The Daily Gazette, Oct. 22, 1997, p. A1.
4. H. J. Hebert: Gasoline device creates little pollution—Fuel cells could allow clean, gas-fueled electric cars". The Daily Gazette, Oct. 22, 1997, p. A1.
5. T. Moore: "Market Potential High for Fuel Cells". EPRI Journal, May/June 1997, pp. 6–17.
6. R. D. King, K. B. Haeffner, L. Salasco, R. A. Koegl: "Hybrid Electric Transit Bus", IEEE Spectrum, July 1995, pp. 26–31.
7. L. O'Connor "Building natural gas locomotives—A liquefied natural gas-fueled locomotive built by Morrison Knudsen . . . " Mechanical Engineering, Apr. 1994, pp. 82–84.
8. F. Fedler "Wasserstoff ist auch beim Flugzeug Energiequelle der Zukunft" ("Even for the airplane, [liquid] hydrogen is the energy source of the future"). Die Welt, Apr. 7, 1996.
9. G. Stanley, K. Bradshaw, "Precision DC-to-AC power conversion by optimization of the output current waveform—the Half-Bridge revisited," PESC-97, pp. 993–999, June 1997
10. Walker, D. Hazelton, M. T. Gardner, et.al.: "Performance of Coils Wound from Long Lengths of Surface Coated, Reacted, BSCCO2212 Conductor." *IEEE Trans. on Applied Superconductivity*, Vol. 7, No. 2, June 1997, pp. 889–892.

11. R. Fillion, W. A. Hennessy, H. Cole, J. Park, and V. Vandor, "Development of a Plastic Encapsulated Power Multichip Technology for High Volume, Low Cost Commercial Electronics," ISHM '94 Proceedings, pp. 84–90

12. R. Fisher, R Fillion, J. Burgess, W. Hennessy, "High-Frequency, Low Cost, Power Packaging Using Thin Film Power Overlay Technology," APEC-95

13. W. Daum, R. J. Saia, R Fillion, G. Forman, "High-G Multichip Modules for Defense Systems Using HDI," ISHM '94 Proceedings, pp. 232–236

What is claimed is:

1. A system for powering an electric motor, comprising:

an electronic drive unit having a power input and a power output for connection to an electric motor, said drive unit including circuits having semiconductor components with performance characteristics that are enhanced at temperatures below ambient, said power output of said drive unit being compatible with performance requirements of said electric motor;

an electrical power generator system electrically connected to and supplying power to said electronic drive circuit power input, said electrical power generator system including an oxygen/hydrogen fuel cell;

a refrigeration unit thermally connected to said drive unit to cool said circuits with semiconductor components below ambient temperature and to enhance performance;

an electric motor having controllable output and performance requirements, cooling said motor enhancing its operating performance, said drive unit power output having an electrical connection to said electric motor to power said motor, said refrigeration unit being thermally connected to said electric motor to cool said motor and enhance motor performance.

2. A system as in claim 1, wherein said refrigeration unit includes a tank containing one of hydrogen and liquid natural gas to provide hydrogen fuel to said fuel cell and to serve as a system coolant.

3. A system as in claim 2, wherein said tank is contained within an enclosure containing liquid nitrogen.

4. A system as in claim 2, wherein said motor includes at least one of coils and windings of superconducting material, said motor being cryo-cooled via thermal connection between said tank and said motor, said tank content being at cryogenic temperature to maintain said coils and windings in a superconducting state.

5. A system as in claim 2, wherein said tank contains liquid natural gas, said liquid natural gas being delivered to said fuel cell by way of tubes and a reformer generating hydrogen from said liquid natural gas.

6. A system as in claim 2, wherein said tank contains hydrogen, said electronic drive unit being positioned in a temperature environment maintained by said hydrogen between 20K and 200K.

7. A system as in claim 2, wherein said electronic drive unit is sealed in a container, said container being immersed in said tank, said tank containing liquid natural gas.

8. A system as in claim 2, wherein said tank is thermally connected to said electronic drive unit by cold fingers, said drive unit being cooled by heat conduction along said fingers.

9. A system for powering an electric motor, comprising:

an electronic drive unit having a power input and a power output for connection to an electric motor, said drive unit including circuits having semiconductor components with performance characteristics that are enhanced at temperatures below ambient, said power output of said drive unit being compatible with performance requirements of said electric motor;

an electrical power generator system electrically connected to and supplying power to said input of said electronic drive circuit, said electrical power generator system including an oxygen/hydrogen fuel cell;

a refrigeration unit thermally connected to said drive unit to cool said circuits with semiconductor components below ambient temperature and to enhance performance, said refrigeration unit being thermally connectable to said electric motor to cool said motor.

10. A system as in claim 9, wherein said refrigeration unit includes a tank containing one of hydrogen and liquid natural gas to provide hydrogen fuel to said fuel cell and to serve as a system coolant.

11. A system as in claim 10, wherein said tank is contained within an enclosure containing liquid nitrogen.

12. A system as in claim 10, wherein said tank contains liquid natural gas, said liquid natural gas being delivered to said fuel cell by way of tubes and a reformer generating hydrogen from said liquid natural gas.

13. A system as in claim 10, wherein said tank contains hydrogen, said electronic drive unit being positioned in a temperature environment maintained by said hydrogen between 20K and 200K.

14. A system as in claim 10, wherein said electronic drive unit is sealed in a container, said container being immersed in said tank, said tank containing liquid natural gas.

15. A system for powering an electric power consuming unit, comprising:

an electronic drive unit having a power input and a power output for connection to an electric power consuming unit, said drive unit including circuits having semiconductor components with performance characteristics that are enhanced at temperatures below ambient, said power output of said drive unit being compatible with performance requirements of said electric power consuming unit;

an electrical power generator system electrically connected to and supplying power to said electronic drive circuit power input, said electrical power generator system including a fuel cell;

a refrigeration unit thermally connected to said drive unit to cool said circuits with semiconductor components below ambient temperature and to enhance performance, said refrigeration unit being thermally connectable to said electric power consuming unit to cool said power consuming unit.

16. A system as in claim 15, wherein said refrigeration unit includes a tank containing one of hydrogen and liquid natural gas to provide hydrogen fuel to said fuel cell and to serve as a system coolant.

17. A system as in claim 16, wherein said tank contains hydrogen, said electronic drive unit being positioned in a temperature environment maintained by said hydrogen between 20K and 200K.

18. A system as in claim 15, wherein said tank contains liquid natural gas, said liquid natural gas being delivered to said fuel cell by way of tubes and a reformer generating hydrogen from said liquid natural gas.

* * * * *